United States Patent
Sato

(10) Patent No.: US 12,388,162 B2
(45) Date of Patent: Aug. 12, 2025

(54) MARCHAND BALUN FORMED IN A LAMINATED SUBSTRATE AND INCLUDING A MAIN LINE AND SUB-LINES, WHERE A PARALLEL LINE IS CONNECTED TO A SUB-LINE

(71) Applicant: Murata Manufacturing Co., Ltd., Kyoto (JP)

(72) Inventor: Takuya Sato, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 283 days.

(21) Appl. No.: 17/938,160

(22) Filed: Oct. 5, 2022

(65) Prior Publication Data
US 2023/0027154 A1    Jan. 26, 2023

Related U.S. Application Data

(63) Continuation of application No. PCT/JP2021/016435, filed on Apr. 23, 2021.

(30) Foreign Application Priority Data

May 13, 2020  (JP) ................. 2020-084219

(51) Int. Cl.
 *H01P 5/10* (2006.01)
 *H03H 7/42* (2006.01)
(52) U.S. Cl.
 CPC .............. *H01P 5/10* (2013.01); *H03H 7/42* (2013.01)
(58) Field of Classification Search
 CPC .................... H01P 5/10; H03H 7/42
 USPC ............................................. 333/26
 See application file for complete search history.

(56) References Cited

U.S. PATENT DOCUMENTS

| 6,133,806 A | 10/2000 | Sheen |
| 2006/0071738 A1 | 4/2006 | Yasuda et al. |
| 2011/0102096 A1 | 5/2011 | Jeong et al. |

(Continued)

FOREIGN PATENT DOCUMENTS

| CN | 1755978 A | 4/2006 |
| JP | 2000-188218 A | 7/2000 |
| JP | 2002-217670 A | 8/2002 |

(Continued)

OTHER PUBLICATIONS

International Search Report for PCT/JP2021/016435 dated Jul. 13, 2021.

*Primary Examiner* — Benny T Lee
(74) *Attorney, Agent, or Firm* — McDonald Hopkins LLC

(57) ABSTRACT

A balun includes an unbalanced terminal; first and second balanced terminals; first and second main lines; first and second sub-lines; and a parallel line. The first main line has an end connected to the unbalanced terminal. The second main line has an end connected to another end of the first and second end that is open. The first sub-line is connected between the first and a reference potential, and is coupled to the first main line. The second sub-line is connected between the second balanced terminal and the reference potential, and is coupled to the second main line. The parallel line is connected in parallel with a part of the first sub-line. The line length of a specific portion of the first sub-line that is connected in parallel with the parallel line is different from the line length of the parallel line.

2 Claims, 15 Drawing Sheets

(56) References Cited

U.S. PATENT DOCUMENTS

2020/0220516 A1* 7/2020 Lin et al. .................. H03F 3/26

FOREIGN PATENT DOCUMENTS

| JP | 2002-280221 A | 9/2002 |
| JP | 2003-110314 A | 4/2003 |
| JP | 2011-101341 A | 5/2011 |

* cited by examiner

MARCHAND BALUN FORMED IN A LAMINATED SUBSTRATE AND INCLUDING A MAIN LINE AND SUB-LINES, WHERE A PARALLEL LINE IS CONNECTED TO A SUB-LINE

CROSS REFERENCE TO RELATED APPLICATION

This is a continuation of International Application No. PCT/JP2021/016435 filed on Apr. 23, 2021 which claims priority from Japanese Patent Application No. 2020-084219 filed on May 13, 2020. The contents of these applications are incorporated herein by reference in their entireties.

BACKGROUND ART

Technical Field

The present disclosure relates to baluns that convert signals between an unbalanced line and a balanced line, and more particularly to a structure for improving the characteristics of a laminated-type balun.

Baluns are converters used for interconversion between an unbalanced signal and a balanced signal. A balanced signal includes a pair of signals having equal amplitude and phases that are inverted from each other, and is generally used in differential amplifier circuits in ICs in communication systems. In contrast, an unbalanced signal is a signal used in a transmission method that transmits changes in electric potential relative to ground potential, and input/output signals of a microstrip line or an antenna correspond to an unbalanced signal.

For example, Japanese Unexamined Patent Application Publication No. 2002-280221 (Patent Document 1) discloses a so-called "Marchand balun" in which two lines having a length of 2/4 and connected to a balanced line are coupled to a line connected to an unbalanced line and having a length of $\lambda/2$, which is ½ of wavelength $\lambda$.

Patent Document 1: Japanese Unexamined Patent Application Publication No. 2002-280221

BRIEF SUMMARY

In a portable radio communication device represented by a smartphone, a mobile phone, or the like, a balun is used in a front-end circuit for connecting an unbalanced line of an antenna and a balanced line of an IC circuit that processes radio-frequency (RF) signals. In recent years, the frequency band of RF signals used for communication has been expanding, and individual components that form the device, such as a balun, are also required to handle a wider bandwidth. In addition, it is desirable to reduce power consumption by reducing losses in components forming each device, and to enable long-term operation with a certain amount of charge.

The present disclosure improves the bandpass characteristic of a balun used in a communication device.

A balun according to a first aspect of the present embodiment includes: an unbalanced terminal; a first balanced terminal and a second balanced terminal; a first main line and a second main line; a first sub-line and a second sub-line; and a parallel line. The first main line has a first end connected to the unbalanced terminal. The second main line has a first end connected to a second end of the first main line, and a second end that is open. The first sub-line is connected between the first balanced terminal and a reference potential, and is coupled to the first main line. The second sub-line is connected between the second balanced terminal and the reference potential, and is coupled to the second main line. The parallel line is connected in parallel with a part of the first sub-line. A line length of a specific portion of the first sub-line that is connected in parallel with the parallel line is different from a line length of the parallel line.

A balun according to a second aspect of the present embodiment includes: a dielectric substrate in which a plurality of dielectric layers are laminated; an unbalanced terminal, a first balanced terminal, a second balanced terminal, and a reference potential terminal provided on the dielectric substrate; a first main line and a second main line; a first sub-line and a second sub-line; and a parallel line. The first main line has a first end connected to the unbalanced terminal. The second main line has a first end connected to a second end of the first main line, and a second end that is open. The first sub-line is connected between the first balanced terminal and a reference potential. The second sub-line is connected between the second balanced terminal and the reference potential. The parallel line is connected in parallel with a part of the first sub-line. In the dielectric substrate, the lines are arranged in an order of the first main line, the first sub-line, the parallel line, the second sub-line, and the second main line in a laminating direction. A line length of a specific portion of the first sub-line that is connected in parallel with the parallel line is different from a line length of the parallel line.

According to the balun according to the present disclosure, a parallel line connected in parallel with a part of the first sub-line coupled to the first main line connected to the unbalanced terminal is arranged. The line length of the parallel line is different from the line length of a specific portion of the first sub-line that is connected in parallel with the parallel line. By adopting such a configuration, the phase difference in the passband may be adjusted. Therefore, the improvement of bandpass characteristics of the balun may be realized.

DETAILED DESCRIPTION

Figure 1:
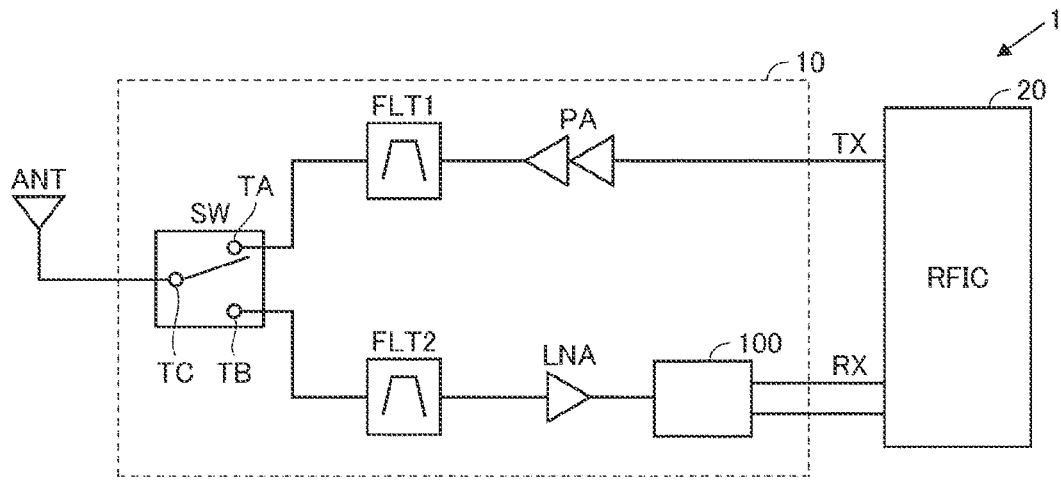
FIG. 1 is a block diagram of a communication device provided with a front-end circuit to which a balun according to an embodiment is applied.

Hereinafter, an embodiment of the present disclosure will be described in detail with reference to the drawings. Note that the same or corresponding portions in the drawings will be given the same reference sign and the description thereof is not repeated.

[Outline of Communication Device]

FIG. 1 is a block diagram of a communication device 1 provided with a front-end circuit 10 to which a balun 100 according to the embodiment is applied. Referring to FIG. 1, the communication device 1 includes, in addition to the front-end circuit 10, an antenna ANT and an RFIC 20, which is a signal processing circuit.

The RFIC 20 outputs a radio-frequency (RF) signal that is a transmission signal to a transmission-side line TX, and the output RF signal is emitted as radio waves from the antenna ANT via the front-end circuit 10. The RFIC 20 also receives radio waves received at the antenna ANT as an RF signal that is a reception signal from a reception-side line RX, processes the reception signal, and transmits the processed reception signal to a subsequent circuit.

The front-end circuit 10 includes, in addition to the balun 100, a switch SW, filters FLT1 and FLT2, a power amplifier PA, and a low-noise amplifier LNA. The switch SW is used for switching between transmission and reception of radio waves at the antenna ANT. The switch SW includes a common terminal TC and two selection terminals TA and TB. The common terminal TC is connected to the antenna ANT. The selection terminal TA is connected to the transmission-side line TX with the filter FLT1 and the power amplifier PA interposed therebetween. The selection terminal TB is connected to the reception-side line RX with the filter FLT2, the low noise amplifier LNA, and the balun 100 interposed therebetween.

To emit radio waves from the antenna ANT, the common terminal TC of the switch SW is connected to the selection terminal TA. In contrast, to receive radio waves at the antenna ANT, the common terminal TC of the switch SW is connected to the selection terminal TB.

The power amplifier PA amplifies an RF signal that is a transmission signal transmitted from the RFIC 20, and outputs the amplified RF signal to the filter FLT1. The filter FLT1 is composed of a low-pass filter, a high-pass filter, or a bandpass filter, and passes a signal in a desired frequency band of the RF signal amplified by the power amplifier PA.

The RF signal that has passed through the filter FLT1 is emitted as radio waves from the antenna ANT via the switch SW.

Like the above-mentioned filter FLT1, the filter FLT2 is composed of a low-pass filter, a high-pass filter, or a bandpass filter, and passes a signal in a desired frequency band of an RF signal that is a reception signal received at the antenna ANT. The RF signal that has passed through the filter FLT2 is amplified with low noise by the low-noise amplifier LNA and is transmitted to the balun 100.

The balun 100 is a converter for converting an unbalanced signal to a balanced signal. A balanced signal includes a pair of signals with equal amplitude and phases that are inverted from each other, and an unbalanced signal is a signal used in a transmission method that transmits changes in electric potential relative to ground potential. In general, a line connected to an antenna is an unbalanced line. In contrast, processing is performed using a balanced signal in an IC circuit such as the RFIC 20. Therefore, a reception signal from the antenna ANT, which is transmitted as an unbalanced signal, is converted, using the balun 100, to a balanced signal suitable for processing in the RFIC 20.

[Configuration of Balun]

Figure 2:
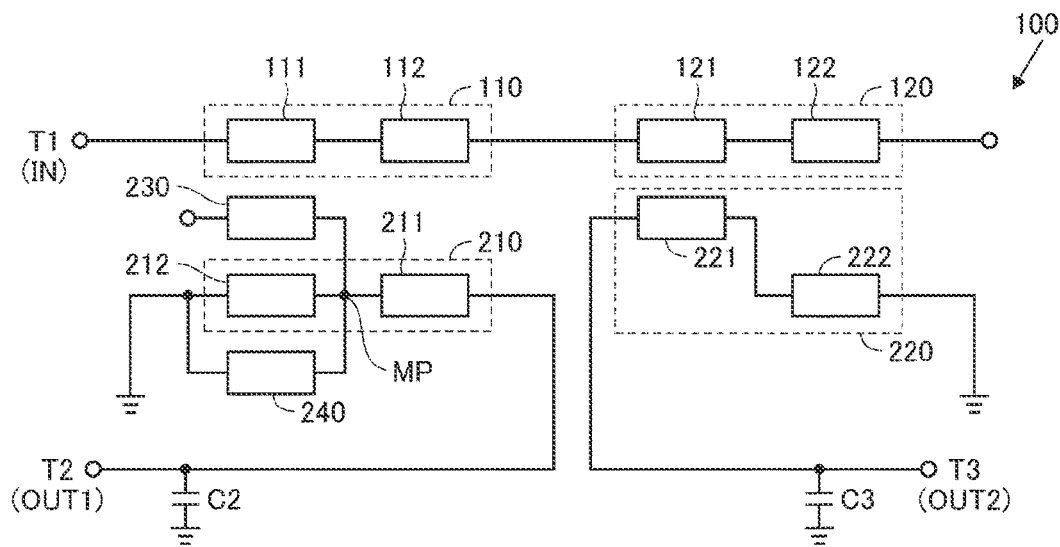
FIG. 2 is an example of a circuit diagram of the balun in FIG. 1.

FIG. 2 is an example of a circuit diagram of the balun 100 in FIG. 1. Referring to FIG. 2, the balun 100 includes an unbalanced terminal T1, two balanced terminals (a first balanced terminal T2 and a second balanced terminal T3), and four lines 110, 120, 210, and 220. When λ is the wavelength of an RF signal to pass, basically each of the above lines has an electrical length of λ/4.

In the following description, the case of converting an unbalanced signal to a balanced signal using the unbalanced terminal T1 as an input terminal IN and the first balanced terminal T2 and the second balanced terminal T3 as output terminals OUT1 and OUT2, respectively, will be described by way of example. Note that the balun 100 may also be used in the case of converting a balanced signal input to the first balanced terminal T2 and the second balanced terminal T3 to an unbalanced signal and outputting the unbalanced signal from the unbalanced terminal T1.

The balun 100 is a so-called "Marchand balun" in which two lines having a length of λ/4 and connected to a balanced line are coupled to a line connected to an unbalanced line and having a length of λ/2, which is ½ of the wavelength λ. More specifically, the unbalanced line connected to the unbalanced terminal T1 includes two lines (the first main line 110 and the second main line 120) connected in series. The first main line 110 has a first end connected to the unbalanced terminal T1, and a second end connected to a first end of the second main line 120. A second end of the second main line is open.

The first main line 110 includes a first portion 111 connected to the unbalanced terminal T1 and a second portion 112 connected in series to the first portion 111. In addition, the second main line 120 includes a third portion 121 connected to the second portion 112 of the first main line 110 and a fourth portion 122 connected in series to the third portion 121.

The first sub-line 210 is connected between the first balanced terminal T2 and a reference potential (ground potential). The first sub-line 210 is electromagnetic-field coupled to the first main line 110 of the unbalanced line. The first sub-line 210 includes a fifth portion 211 connected to the first balanced terminal T2, and a sixth portion 212 connected between the fifth portion 211 and the reference potential. In the first sub-line 210, the first portion 111 and the sixth portion 212 are coupled, and the second portion 112 and the fifth portion 211 are coupled.

Similarly, the second sub-line 220 is connected between the second balanced terminal T3 and the reference potential. The second sub-line 220 is electromagnetic-field coupled to the second main line 120 of the unbalanced line. The second sub-line 220 includes a seventh portion 221 connected to the second balanced terminal T3, and an eighth portion 222 connected between the seventh portion 221 and the reference potential. In the second sub-line 220, the third portion 121 and the seventh portion 221 are coupled, and the fourth portion 122 and the eighth portion 222 are coupled.

A capacitor C2 is connected between the first balanced terminal T2 and the reference potential. In addition, a capacitor C3 is connected between the second balanced terminal T3 and the reference potential. The capacitors C2 and C3 are provided for adjusting the impedance. Note that the capacitors C2 and C3 are optional configurations, and, if the impedance is adjustable using the configuration of other elements, one or both of the capacitors C2 and C3 might not be provided. Note that the "capacitor C2" and the "capacitor C3" in the embodiment correspond to a "first capacitor" and a "second capacitor", respectively, in the present disclosure.

With such a configuration, an RF signal input to the unbalanced terminal T1 (input terminal IN) is transmitted to two balanced lines by electromagnetic field coupling, and is output as a balanced signal from the first balanced terminal T2 (output terminal OUT1) and the second balanced terminal T3 (output terminal OUT2).

In the balun 100 of the present embodiment, the balanced line connected to the first balanced terminal T2 is provided with, in addition to the first sub-line 210 described above, a first line 230 and a second line 240. The first line 230 has a first end connected to a midpoint MP (the node between the fifth portion 211 and the sixth portion 212) of the first sub-line 210, and a second end that is open. The first line 230 is electromagnetic-field coupled to the first portion 111 of the first main line 110 and the sixth portion 212 of the first sub-line. As will be described later, because a pole is generated in the high frequency domain of the passband due to the first line 230, the return loss is reduced.

Figure 3:
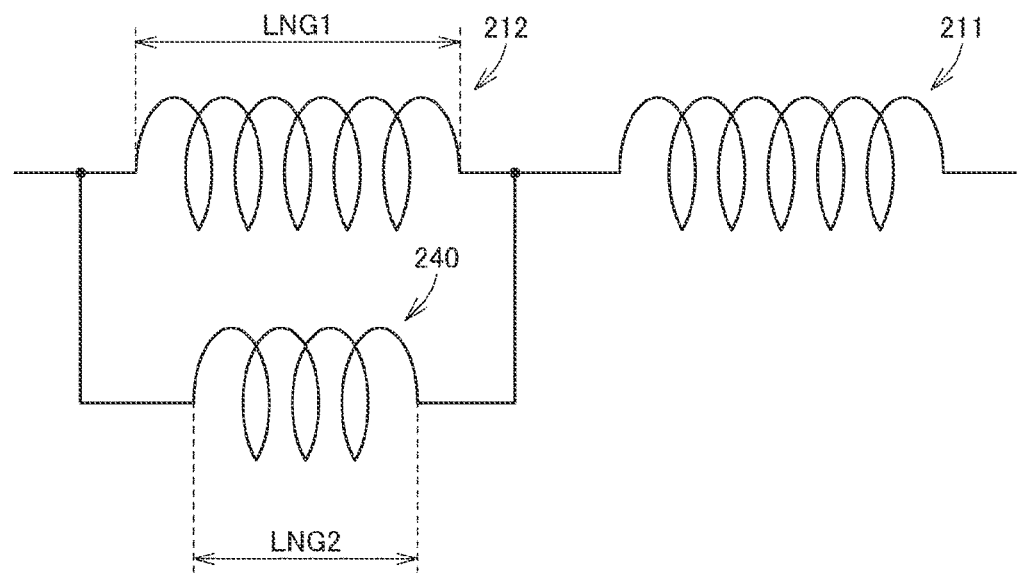
FIG. 3 is a diagram describing the relationship between the line length of a first sub-line and the line length of a second line in FIG. 2.

The second line 240 is connected in parallel with the sixth portion 212 of the first sub-line 210. Here, in the balun 100 of the present embodiment, as illustrated in FIG. 3, a line length LNG2 of the second line 240 is shorter than a line length LNG1 of the sixth portion 212 of the first sub-line 210. Accordingly, the phase of a signal output from the first balanced terminal T2 is delayed. In contrast, if the line length LNG2 of the second line 240 is longer than the line length LNG1 of the sixth portion 212, the phase of a signal output from the first balanced terminal T2 is advanced. As mentioned above, depending on the line length of the second line 240, the phase difference between a signal output from the first balanced terminal T2 and a signal output from the second balanced terminal T3 may be adjusted.

Moreover, in the balun 100 of the present embodiment, the second sub-line 220 has a portion that is strongly coupled to the second main line 120 and a portion that is weakly coupled to the second main line 120. The strength of coupling between the seventh portion 221 of the second sub-line 220 and the third portion 121 of the second main line 120 is stronger than the strength of coupling between the eighth portion 222 of the second sub-line 220 and the fourth portion 122 of the second main line 120. More specifically, the distance between the seventh portion 221 of the second sub-line 220 and the third portion 121 of the second main line 120 is shorter than the distance between the eighth portion 222 of the second sub-line 220 and the fourth portion 122 of the second main line 120.

As mentioned above, in the second sub-line 220 coupled to the second main line 120, the impedance of the eighth portion 222 close to the reference potential is larger than the impedance of the seventh portion 221, thereby realizing a wide bandwidth of the bandpass characteristics.

Note that the "second line 240" in the embodiment corresponds to a "parallel line" in the present disclosure. In addition, the "sixth portion 212" in the embodiment corresponds to a "specific portion" in the present disclosure.

Figure 4:
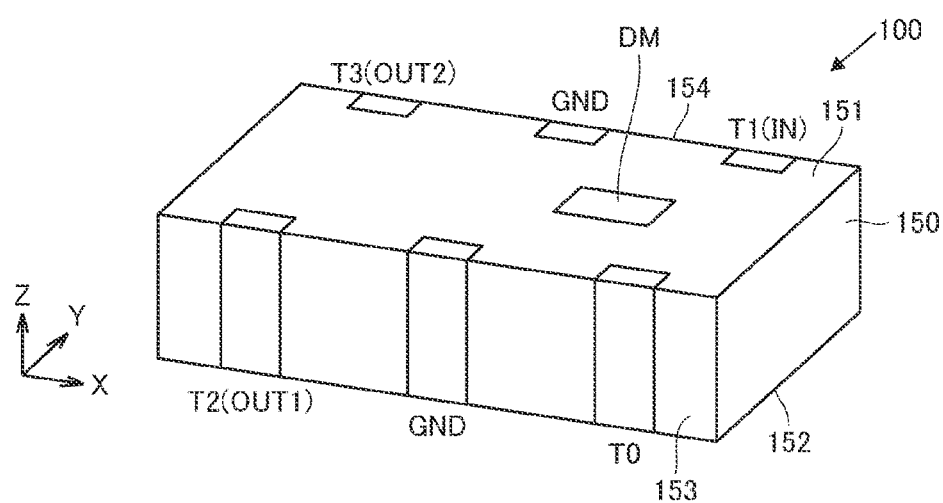
FIG. 4 is an external perspective view of the balun in FIG. 2.
Figure 5:
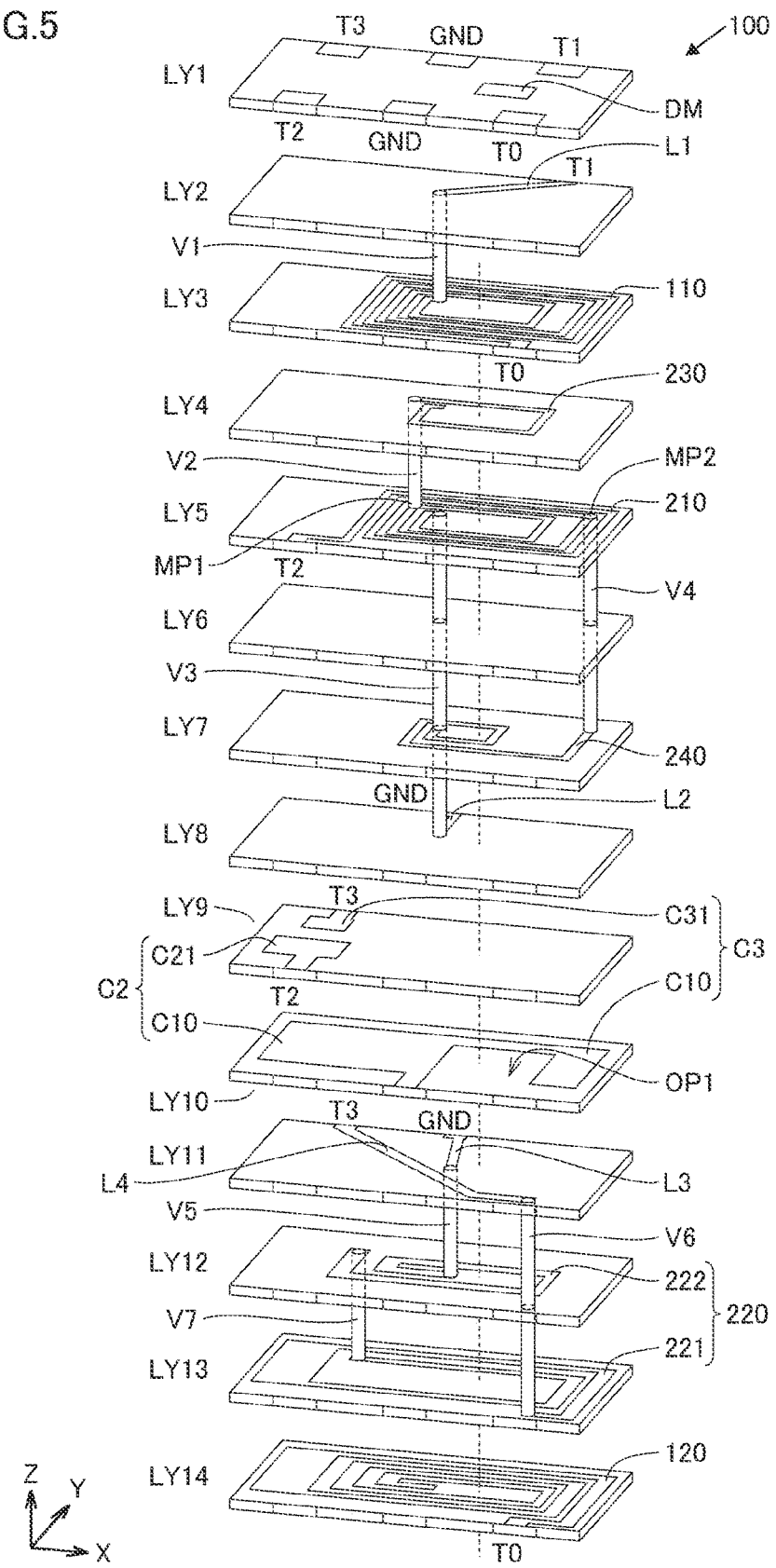
FIG. 5 is an exploded perspective view of the balun in FIG. 2.

Next, the structure of the balun illustrated in FIG. 2 will be described in detail using FIGS. 4 and 5. FIG. 4 is an external perspective view of the balun 100. In addition, FIG. 5 is an exploded perspective view of the balun 100. As illustrated in FIG. 4, the balun 100 includes a dielectric substrate 150 having a substantially cuboid shape. In FIGS. 4 and 5, the laminating direction of the dielectric substrate 150 serves as the Z axis, a direction along the long side of the dielectric substrate 150 as the X axis, and a direction along the short side as the Y axis. In the following description, a face of the dielectric substrate 150 in the positive direction of the Z axis may also be referred to as an upper face 151, and a face in the negative direction of the Z axis as a lower face 152. Moreover, a face of the dielectric substrate 150 in the negative direction of the Y axis may also be referred to as a side face 153, and a face in the positive direction of the Y axis also as a side face 154.

Referring to FIGS. 4 and 5, the balun 100 includes the dielectric substrate 150 in which a plurality of dielectric layers LY1 to LY14 are laminated, and which has a substantially cuboid outer shape. On the outer surface of the dielectric substrate 150, a plurality of substantially-C-shaped outer electrodes, extending across the upper face 151, the side faces 153 and 154, and the lower face 152, are provided. The outer electrodes are used for connection with an external device and are also used for connection between the wiring patterns of the individual layers of the dielectric substrate 150. The outer electrodes include the unbalanced terminal T1, the balanced terminals T2 and T3, a ground terminal GND (reference potential terminal) for connecting to the reference potential, and a connection terminal T0 for interlayer connection. The upper face 151 of the dielectric substrate 150 is marked with a directional mark DM representing the direction.

As illustrated in FIG. 5, the lines 110, 120, 220 (221 and 222), 230, and 240 included in the balun 100 are coils whose winding direction is the Z axis direction. In addition, in the case where the dielectric substrate 150 is viewed in plan from the laminating direction (Z axis direction), the openings of the coils of the individual lines at least partially overlap with one another. Note that the openings of the coils represent, in the case where the dielectric substrate is viewed in plan from the Z axis direction, internal portions surrounded by the coils formed in the lines in a ring shape around the winding axis. In addition, as illustrated in FIG. 5, the lines may be wound around a common winding axis.

In the dielectric substrate 150, the lines 110, 120, 220 (221 and 222), 230, and 240 are arranged from the upper face 151 toward the lower face 152 in the laminating direction, and are arranged in the order of the first main line 110, the first line 230, the first sub-line 210, the second line 240, the second sub-line 220, and the second main line 120. Each line is provided on one dielectric layer or over two adjacent dielectric layers. The dielectric layers are connected by vias provided inside the dielectric substrate 150 or by outer electrodes provided on the outer surface of the dielectric substrate 150.

More specifically, the first main line 110 is wound on the third layer LY3 in the counterclockwise (CCW) direction from the inner circumference toward the outer circumference of the coil when viewed in plan from the positive direction of the Z axis. An inner circumference end of the first main line 110 is connected to the unbalanced terminal T1 (input terminal IN) provided on the outer surface of the dielectric substrate 150 with a via V1, and a line L1 provided on the second layer LY2 interposed therebetween. In addition, an outer circumference end of the first main line 110 is connected in the third layer LY3 to the connection terminal T0 provided on the outer surface of the dielectric substrate 150.

The second main line 120 is wound on the fourteenth layer LY14, which is the lowest layer, in the clockwise (CW) direction from the inner circumference toward the outer circumference of the coil when viewed in plan from the positive direction of the Z axis. An inner circumference end of the second main line 120 is connected to nowhere and is an open end. An outer circumference end of the second main line 120 is connected in the fourteenth layer LY14 to the connection terminal T0 provided on the outer surface of the dielectric substrate 150. By the connection terminal T0, the second main line 120 is connected in series to the first main line 110.

The first sub-line 210 is wound on the fifth layer LY5 in the CCW direction from the inner circumference toward the outer circumference of the coil when viewed in plan from the positive direction of the Z axis. An inner circumference end of the first sub-line 210 is connected to a line L2 provided in the eighth layer LY8 with a via V3 interposed therebetween. The line L2 is connected in the eighth layer LY8 to the ground terminal GND provided on the outer surface of the dielectric substrate 150. An outer circumference end of the first sub-line 210 is connected in the fifth layer LY5 to the first balanced terminal T2 (output terminal OUT1) provided on the outer surface of the dielectric substrate 150.

The first line 230 is provided on the fourth layer LY4, which is between the third layer LY3 where the first main line 110 is provided and the fifth layer LY5 where the first sub-line 210 is provided. The first line 230 is wound in the CCW direction from the inner circumference toward the outer circumference of the coil when viewed in plan from the positive direction of the Z axis. An inner circumference end of the first line 230 is an open end. An outer circumference end of the first line 230 is connected to a midpoint MP1 of the first sub-line 210 with a via V2 interposed therebetween. The midpoint MP1 is at a position that includes neither the outer circumference end nor the inner circumference end of the first sub-line 210. Note that the line length from the midpoint MP1 to the inner circumference end of the first line 230 is different from the line length from the midpoint MP1 to the ground terminal GND by way of the inner circumference end of the first sub-line 210 and the line L2 on the eighth layer LY8.

Because the first line 230 is provided on the dielectric layer between the dielectric layer where the first main line 110 is provided and the dielectric layer where the first sub-line 210 is provided, the first line 230 is electromagnetic-field coupled to both the first main line 110 and the first sub-line 210. Furthermore, the coupling between the first line 230 and the first main line 110 is stronger than the coupling between the first sub-line 210 and the first main line 110.

A second line 240 is provided on the seventh layer LY7. The second line 240 is wound in the CCW direction from the inner circumference toward the outer circumference of the coil when viewed in plan from the positive direction of the Z axis. An inner circumference end of the second line 240 is connected to a via V3, and is connected to the inner circumference end of the first sub-line 210 and to the ground terminal GND with the via V3 interposed therebetween. In addition, an outer circumference end of the second line 240 is connected to a midpoint MP2 of the first sub-line 210 with a via V4 interposed therebetween. That is, the second line 240 is connected in parallel with a part of the first sub-line 210 by the via V3 and the via V4. Although the midpoint MP1 to which the via V2 is connected and the midpoint MP2 to which the via V4 is connected are at different positions in the first sub-line 210 in FIG. 5, the midpoint MP1 and the midpoint MP2 may be at the same position in the first sub-line 210.

The second sub-line 220 is provided over two layers, the twelfth layer LY12 and the thirteenth layer LY13. The eighth portion 222 of the second sub-line 220 is provided on the twelfth layer LY12, and the seventh portion 221 of the second sub-line 220 is provided on the thirteenth layer LY13.

The eighth portion 222 of the second sub-line 220 is wound on the twelfth layer LY12 in the CW direction from the inner circumference toward the outer circumference of the coil when viewed in plan from the positive direction of the Z axis. An inner circumference end of the eighth portion 222 is connected to a line L3 provided on the eleventh layer LY11 with a via V5 interposed therebetween. The line L3 is connected in the eleventh layer LY11 to the ground terminal GND provided on the outer surface of the dielectric substrate 150. In contrast, an outer circumference end of the eighth portion 222 is connected, with a via V7 interposed therebetween, to an inner circumference end of the seventh portion 221 of the second sub-line 220 provided on the thirteenth layer LY13.

The seventh portion 221 of the second sub-line 220 is wound on the thirteenth layer LY13 in the CW direction from the inner circumference toward the outer circumference of the coil when viewed in plan from the positive direction of the Z axis. As described above, the inner circumference end of the seventh portion 221 of the second sub-line 220 is connected to the outer circumference end of the eighth portion 222 on the twelfth layer LY12 with the via V7 interposed therebetween. An outer circumference end of the seventh portion 221 is connected to a line L4 provided on the eleventh layer LY11 with a via V6 interposed therebetween. The line L4 is connected in the eleventh layer LY11 to the second balanced terminal T3 (output terminal OUT2) provided on the outer surface of the dielectric substrate 150. That is, with such connections, the seventh portion 221 and the eighth portion 222 of the second sub-line 220 are connected in series between the second balanced terminal T3 and the ground terminal GND.

In the second sub-line 220, because signals are output from the second balanced terminal T3, the signal transmission direction is a direction from the ground terminal GND toward the second balanced terminal T3. That is, when viewed in the signal transmission direction, the second sub-line 220 is wound on the CW direction from the ground terminal GND toward the second balanced terminal T3. In contrast, the second main line 120 transmits signals from the connection terminal T0 (in other words, the unbalanced terminal T1) to the open end. Therefore, when viewed in the signal transmission direction, the second main line 120 is wound in the CCW direction from the unbalanced terminal T1 toward the open end of the second main line 120. That is, the second main line 120 and the second sub-line 220 are coupled in the reverse winding direction when viewed in the signal transmission direction.

The seventh portion 221 and the eighth portion 222 of the second sub-line 220 are arranged so as not to overlap with each other except for a portion where the seventh portion 221 and the eight portion 222 are connected to each other by the via V7 when viewed in plan from the positive direction of the Z axis. In addition, the entire second sub-line 220 (seventh portion 221+eighth portion 222) when viewed in plan from the positive direction of the Z axis overlaps with the second main line 120 provided on the fourteenth layer LY14. The line width of the second main line 120 is wider than the line width of the second sub-line 220. Since the line width of one line is wider than the line width of the other line, the influence of misalignment of the lines is reduced.

Each of the seventh portion 221 and the eighth portion 222 of the second sub-line 220 is electromagnetic-field coupled to the second main line 120. Here, since the seventh portion 221 is provided on the dielectric layer between the dielectric layer where the eighth portion 222 is provided and the dielectric layer where the second sub-line 220 is provided, the distance between the second sub-line 220 and the seventh portion 221 is shorter than the distance between the second sub-line 220 and the eighth portion 222. Therefore, the coupling between the second sub-line 220 and the seventh portion 221 is stronger than the coupling between the second sub-line 220 and the eighth portion 222.

On the ninth layer LY9, a flat plate electrode C21 connected to the first balanced terminal T2 and a flat plate electrode C31 connected to the second balanced terminal T3 are provided. Moreover, on the tenth layer LY10, a flat plate electrode (ground electrode) C10 connected to the ground terminal GND is provided, and each of the flat plate electrode C21 and the flat plate electrode C31 on the ninth layer LY9 faces the ground electrode C10 on the tenth layer LY10. The flat plate electrode C21 and the ground electrode C10 constitute the capacitor C2 in FIG. 2. The flat plate electrode C31 and the ground electrode C10 constitute the capacitor C3 in FIG. 2.

The ground electrode C10 is provided with an opening OP1 in a part of a portion where the first sub-line 210 and the second sub-line 220 overlap when the dielectric substrate 150 is viewed in plan from the Z axis direction. By the opening OP1, the first sub-line 210 and the second sub-line 220 are electromagnetic-field coupled.

Such a balun is used in a front-end circuit for connecting an unbalanced line of an antenna and a balanced line of an IC circuit that processes RF signals in a portable radio communication device represented by a smartphone, a mobile phone, or the like. In recent years, the frequency band of RF signals used for communication has been expanding, and a balun is also required to improve its bandpass characteristics by handling a wider bandwidth and/or reducing losses.

In the balun 100 of the present embodiment, in addition to the configuration of a general "Marchand balun", a sub-line (first sub-line 210) that is coupled to a main line (first main line 110) on the unbalanced terminal side of the unbalanced line is provided with the first line 230 whose first end is an open end and the second line 240 connected in parallel. Furthermore, in the balun 100, of a sub-line (second sub-line 220) coupled to a main line (second main line 120) on the open end side of the unbalanced line, the anterior portion (seventh portion 221) is arranged closer to the main line than the posterior portion (eighth portion 222). By adopting such a configuration, a wide bandwidth and low losses of the bandpass characteristics may be realized.

Hereinafter, the signal bandpass characteristics of the balun 100 of the present embodiment will be described using comparative examples.

[Characteristics of Balun]

(1) Effects of First Line

Figure 6:
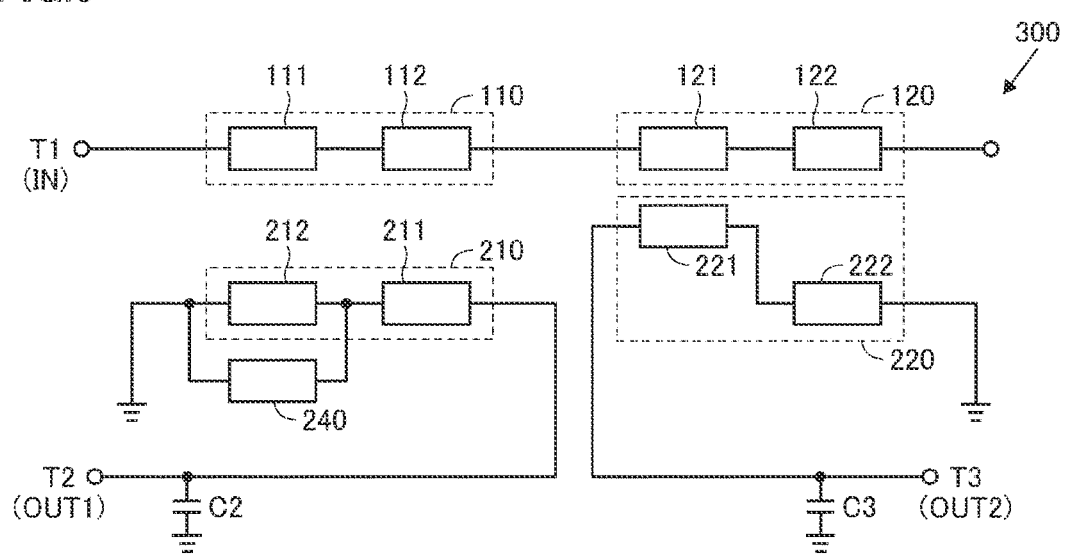
FIG. 6 is a circuit diagram of a balun of a first comparative example.
Figure 7:
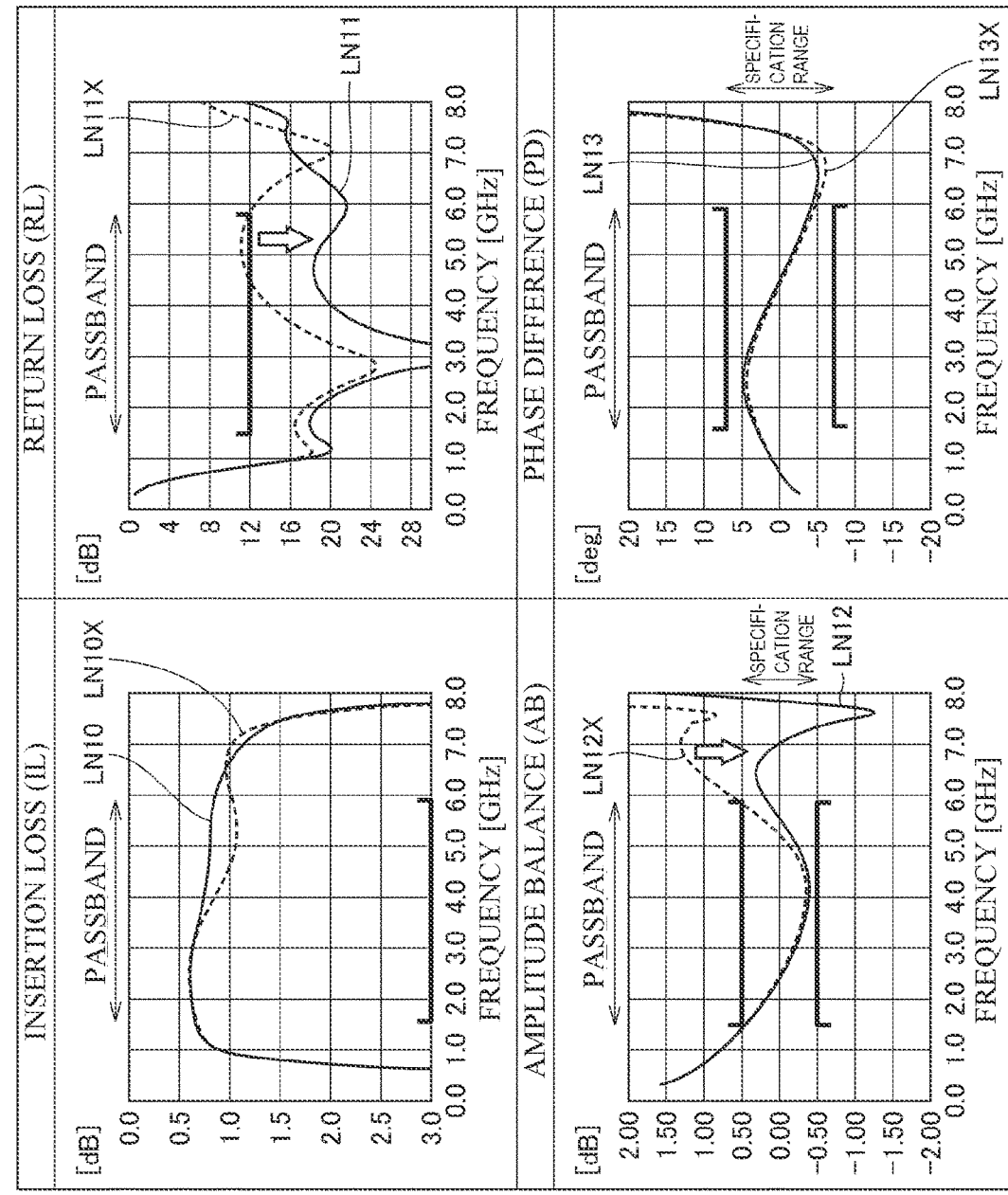
FIG. 7 is a characteristic diagram for describing the comparison between the balun of the embodiment and the balun of the first comparative example.
Figure 8:
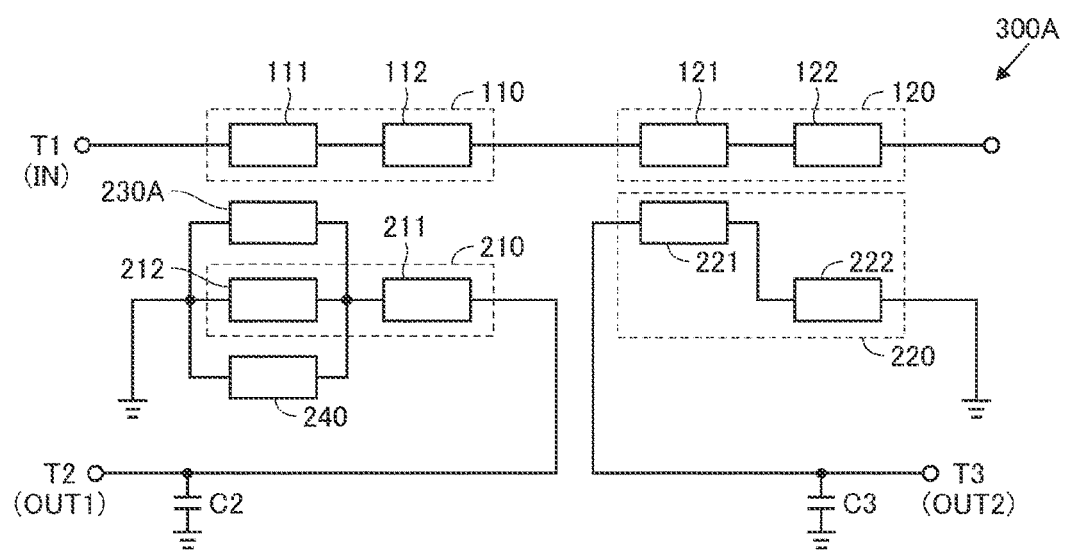
FIG. 8 is a circuit diagram of a balun of a second comparative example.

First, the influence of the first line 230 provided on the first sub-line 210 on the bandpass characteristics will be described using a first comparative example and a second comparative example. FIG. 6 illustrates a circuit diagram of a balun 300 of the first comparative example, and FIG. 7 illustrates the bandpass characteristics of the balun 100 of the embodiment and the balun 300 of the first comparative example. Moreover, FIG. 8 illustrates a circuit diagram of a balun 300A of the second comparative example, and FIG. 9 illustrates the bandpass characteristics of the balun 100 of the embodiment and the balun 300A of the second comparative example.

The balun 300 of the first comparative example has a configuration in which the first line 230 of the balun 100 of the embodiment illustrated in FIG. 2 has been removed. Also, the balun 300A of the second comparative example has a configuration in which the first line 230 of the balun 100 of the embodiment has been replaced by a first line 230A. The first line 230A has a configuration in which the open end of the first line 230 is connected to the reference potential. Since configurations in the baluns 300 and 300A other than those described above are the same as the balun 100, the description of overlapping elements is not repeated.

Figure 9:
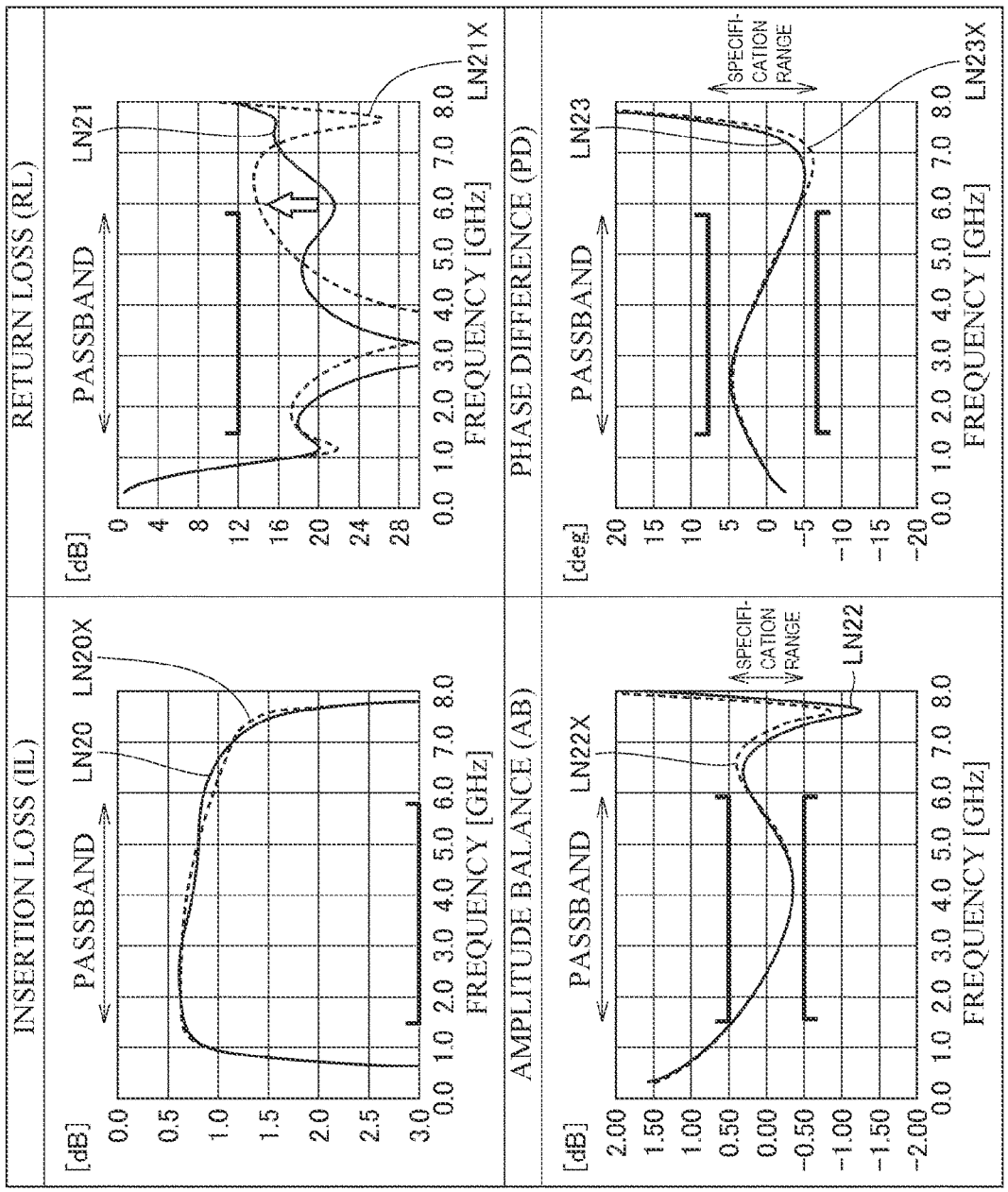
FIG. 9 is a characteristic diagram for describing the comparison between the balun of the embodiment and the balun of the second comparative example.

In FIGS. 7 and 9 and FIGS. 11, 13, 15 and 17 described later, the results of simulating the characteristics of the balun 100 of the embodiment and the comparative examples, including insertion loss (IL), return loss (RL), amplitude balance (AB), and phase difference (PD), are indicated. In FIGS. 7 and 9, solid lines LN10 to LN13 and LN20 to LN23 indicate the case of the balun 100 of the embodiment, and dashed lines LN10X to LN13X and LN20X to LN23X indicate the cases of the comparative examples. Note that the passband specification in the simulation examples is in the range of 1450 MHz to 5800 MHz inclusive.

First Comparative Example

With reference to FIG. 7, the influence of the presence or absence of the first line 230 on the bandpass characteristics will be described.

First, with regard to insertion loss, both of the balun 100 of the embodiment (solid line LN10) and the balun 300 of the first comparative example (dashed line LN10X) satisfy the specification range of 3.0 dB or less over the entire passband. However, in the high frequency domain (around 4000 MHz to 5800 MHz) of the passband, the balun 100 of the embodiment has a smaller insertion loss than the balun 300 of the first comparative example.

With regard to return loss, the balun 300 of the first comparative example (dashed line LN11X) has a return loss larger than the specification range of 12 dB in the high frequency domain of 4400 NHz and above, whereas the balun 100 of the embodiment (solid line LN11) has a return loss smaller than the specification range over the entire passband. As indicated by solid line LN11, in comparison with the balun 300, the balun 100 has a new pole generated in the vicinity of 6000 MHz, and this pole contributes to the reduction of return loss in the high frequency domain. That is, the provision of the first line 230 causes the first line 230 to act as an LC resonance circuit, and the pole is newly generated.

With regard to amplitude balance and phase difference, both of the balun 100 of the embodiment (solid lines LN12 and LN13) and the balun 300 of the first comparative example (dashed lines LN12X and LN13X) have achieved the respective specification ranges (AB: within ±0.5 dB, PD: within ±7°) over the entire passband. However, as compared with the case of the balun 300, the balun 100 of the embodiment has an amplitude balance and a phase difference that are close to zero in a domain slightly higher than the passband (around 6500 MHz to 7000 MHz), and this realizes the homogenization of both characteristics over the passband.

Second Comparative Example

Next, the influence of having the first end of the first line 230 as an open end on the bandpass characteristics will be described using the second comparative example.

Referring to FIG. 9, the insertion loss, return loss, amplitude balance, and phase difference of the balun 300A of the second comparative example are all within their respective specification ranges in the passband. However, especially in a domain above 4800 MHz, the return loss of the balun 300 of the second comparative example is larger than the return loss of the balun 100 of the embodiment. That is, since one of the two ends of the first line 230 is an open end, the return loss in the high frequency domain is small.

A new resonance path is formed by coupling of one of the two ends of the first lines 230, as an open end, with the first portion 111 of the first main line 110. Therefore, by adjusting this coupling, a new resonance point is generated in the passband. This new resonance point reduces the return loss.

Figure 10:
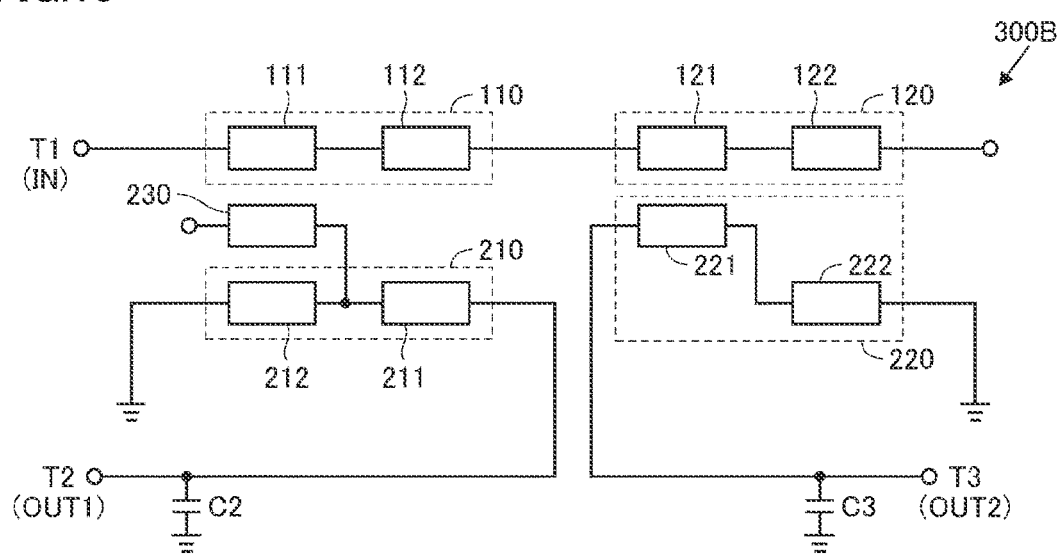
FIG. 10 is a circuit diagram of a balun of a third comparative example.

As described above, since the first line whose first end is open and which is coupled to the first main line and the first sub-line is added to the first sub-line in the "Marchand balun", the insertion loss and return loss in the passband are reduced, thereby improving the bandpass characteristics of the balun.
(2) Effects of Second Line Third Comparative Example Next, the influence of the second line 240 partially connected in parallel with the first sub-line 210 on the bandpass characteristics will be described using a third comparative example. FIG. 10 illustrates a circuit diagram of a balun 300B of the third comparative example, and FIG. 11 indicates the bandpass characteristics of the balun 100 of the embodiment (solid lines LN30 to LN33) and the bandpass characteristics of the balun 300B of the third comparative example (dashed lines LN30X to LN33X).

As illustrated in FIG. 10, the balun 300B of the third comparative example has a configuration in which the second line 240 of the balun 100 of the embodiment has been removed. Since configurations in the balun 300B other than the portion of the second line 240 are the same as the balun 100, the description of overlapping elements is not repeated.

Figure 11:
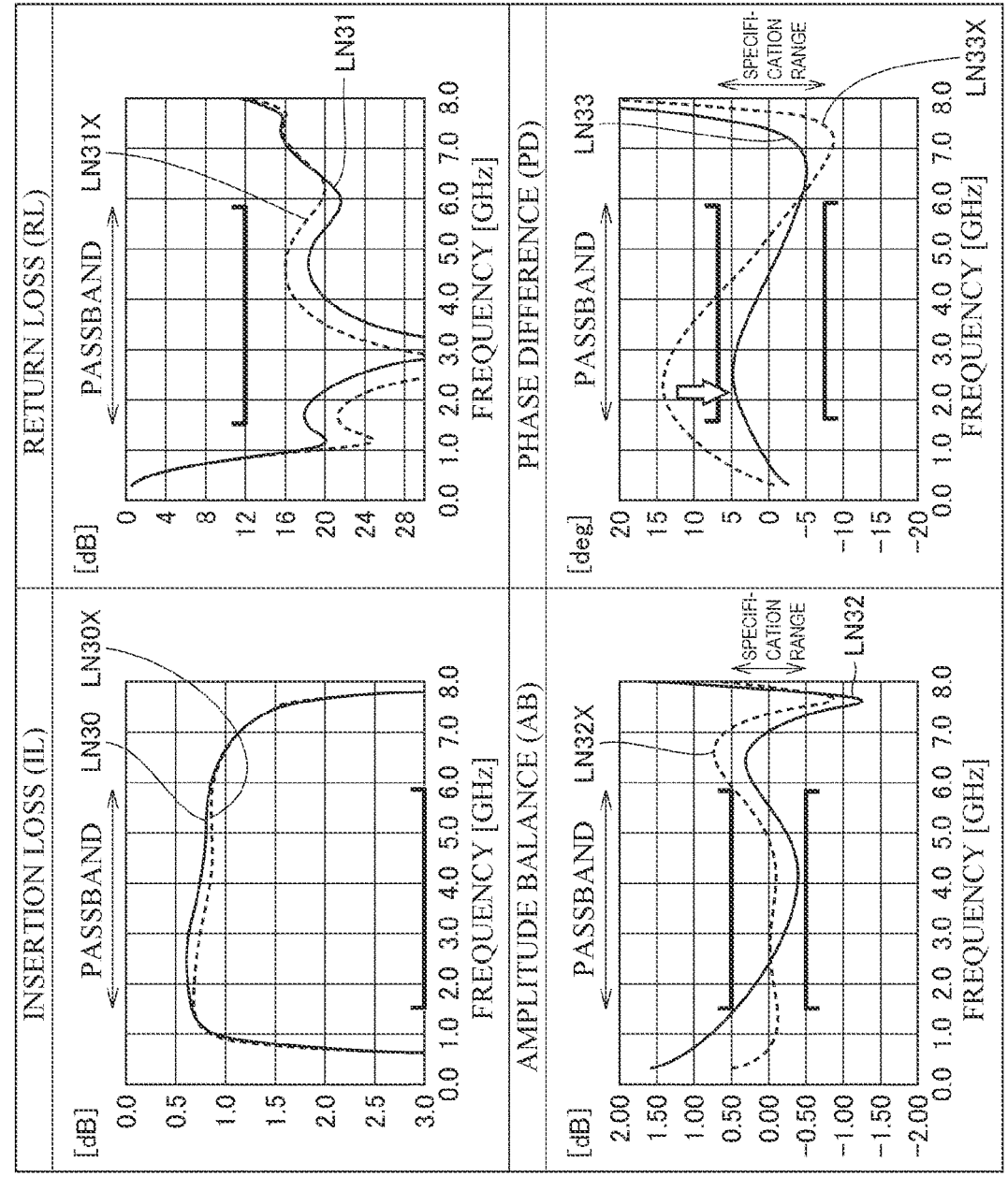
FIG. 11 is a characteristic diagram for describing the comparison between the balun of the embodiment and the balun of the third comparative example.

Referring to FIG. 11, in the balun 300B of the third comparative example, although the return loss (dashed line LN31X) is larger than the balun 100 of the embodiment by about 2 dB in the domain of 3000 MHz and above, the insertion loss, return loss, and amplitude balance (dashed lines LN30X to LN32X) satisfy the respective specification ranges over the entire passband. In contrast, the phase difference (dashed line LN33X) is much greater than the specification range of 7° in the domain of 4000 MHz and below. In other words, the phase difference is improved by providing the first sub-line 210 with the second line 240.

In the case where the second line 240 is connected in parallel with the first sub-line 210, the phase change of signals passing through these lines is influenced by the shorter line out of the first sub-line 210 and the second line 240. In contrast, because the first sub-line 210 is closer to the first main line 110 than the second line 240, the first sub-line 210 is more dominant in terms of coupling to the first main line 110. That is, the influence of the second line 240 on changes in the amount of coupling between the first main line 110 and the balanced line connected to the first balanced terminal T2 is small, and as a result, a change in amplitude is small. Therefore, by providing the second line 240, the phase difference may be adjusted while suppressing changes in amplitude balance.

As described above, since the second line, which is partially connected in parallel with the first sub-line, is provided in the "Marchand balun", the phase difference in the passband is reduced, and the bandpass characteristics of the balun are improved.
(3) Effects of Arrangement of Second Sub-Line Next, the influence of the arrangement of the seventh portion 221 and the eighth portion 222 of the second sub-line 220 on the bandpass characteristics will be described using a fourth comparative example to a sixth comparative example.

Fourth Comparative Example

Figure 12:
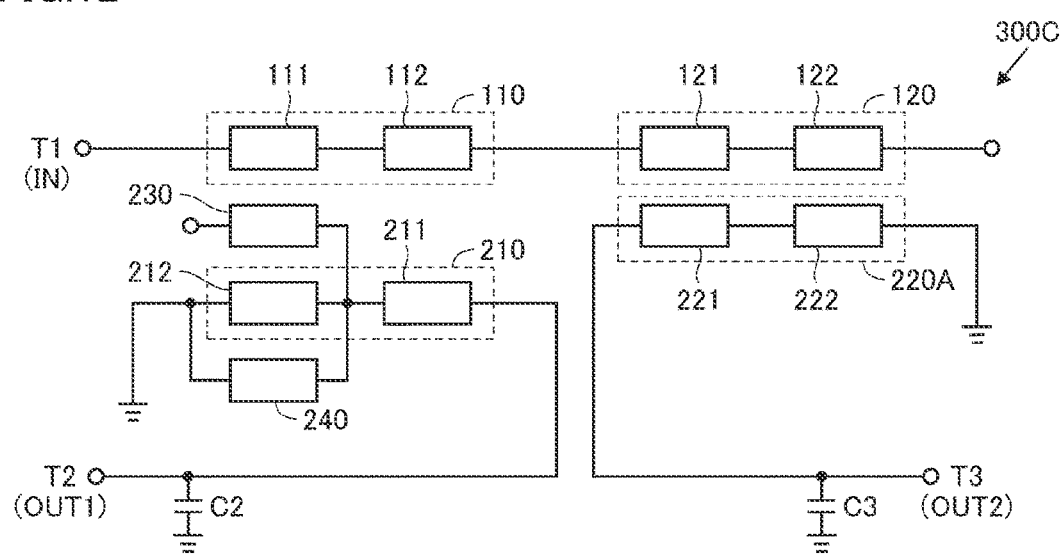
FIG. 12 is a circuit diagram of a balun of a fourth comparative example.

FIG. 12 is a circuit diagram of a balun 300C of the fourth comparative example. The balun 300C of the fourth comparative example has a configuration in which the second sub-line 220 of the balun 100 illustrated in FIG. 2 has been replaced by a second sub-line 220A. In the second sub-line 220A, both the seventh portion 221 and the eighth portion 222 are arranged in close proximity to the second main line 120. More specifically, in the exploded perspective view of FIG. 5, this corresponds to a configuration where the seventh portion 221 and the eighth portion 222 are formed on the thirteenth layer LY13. Since other configurations in the balun 300C are the same as the balun 100 of the embodiment, the description of overlapping elements is not repeated.

Figure 13:
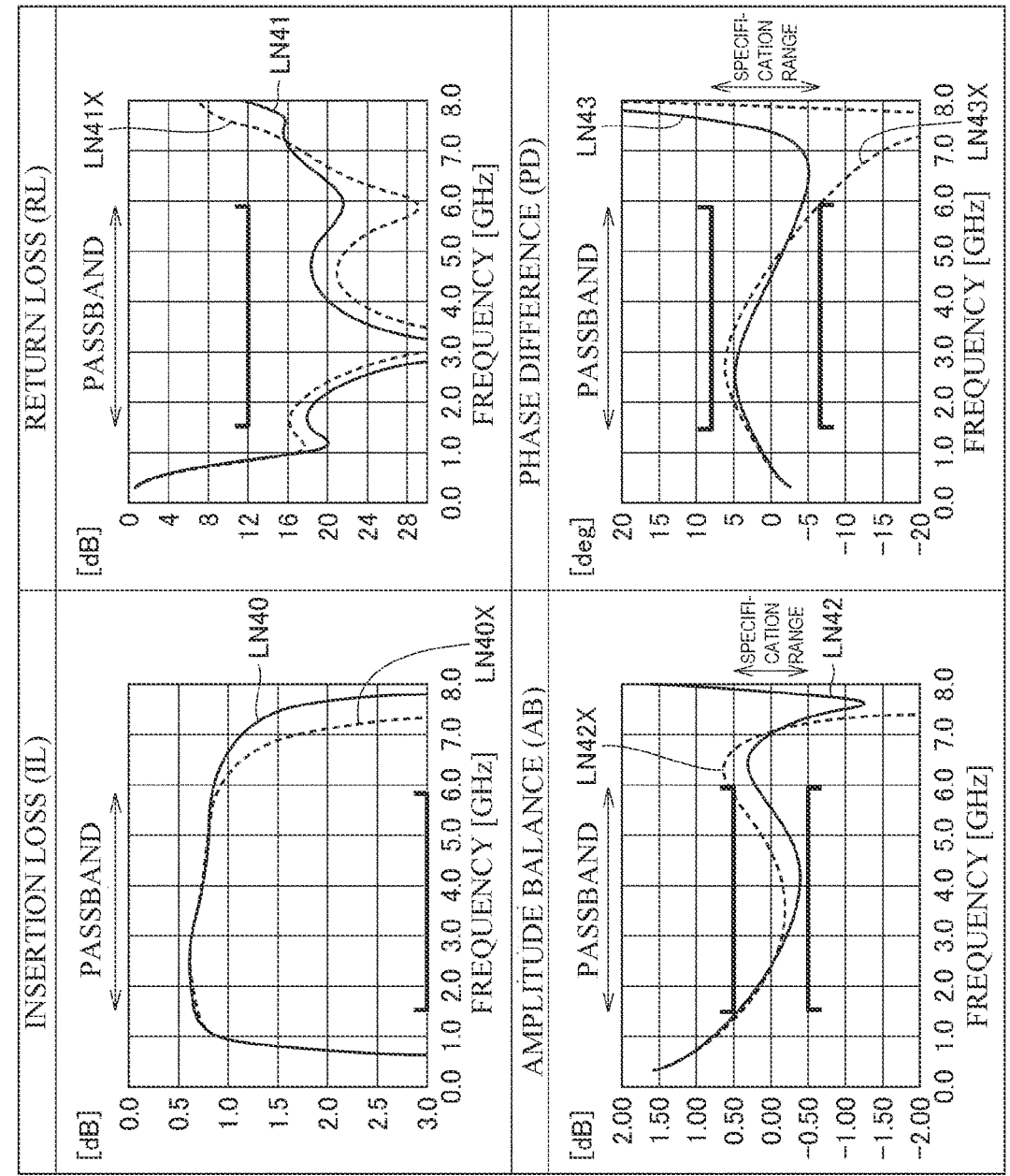
FIG. 13 is a characteristic diagram for describing the comparison between the balun of the embodiment and the balun of the fourth comparative example.

FIG. 13 is a diagram for describing the comparison of the bandpass characteristics of the balun 100 of the embodiment and the balun 300C of the fourth comparative example. FIG. 13 illustrates the bandpass characteristics of the balun 100 of the embodiment (solid lines LN40 to LN43) and the bandpass characteristics of the balun 300C of the fourth comparative example (dashed lines LN40X to LN43X).

Referring to FIG. 13, with regard to insertion loss, although outside the passband, the balun 100 of the embodiment (solid line LN40) has an insertion loss smaller than the balun 300C of the fourth comparative example (dashed line LN40X) in the high frequency domain, thereby realizing a wide bandwidth. Accordingly, even in the passband, the insertion loss is improved in the domain of 5500 MHz and above.

With regard to return loss, in the domain of 3000 MHz and above, the balun 300C of the fourth comparative example (dashed line LN41X) has a return loss lower than the balun 100 of the embodiment (solid line LN41) by 2 dB or more over the entire passband; however, with regard to amplitude balance and phase difference, the balun 100 of the embodiment (solid lines LN42 and LN43) is improved in the high frequency domain of the passband, as compared with the balun 300C of the fourth comparative example (dashed lines LN42X and LN43X).

Therefore, in view of the overall characteristics, it may be said that the balun 100 of the embodiment realizes better bandpass characteristics than the balun 300C of the fourth comparative example.

Fifth Comparative Example

Figure 14:
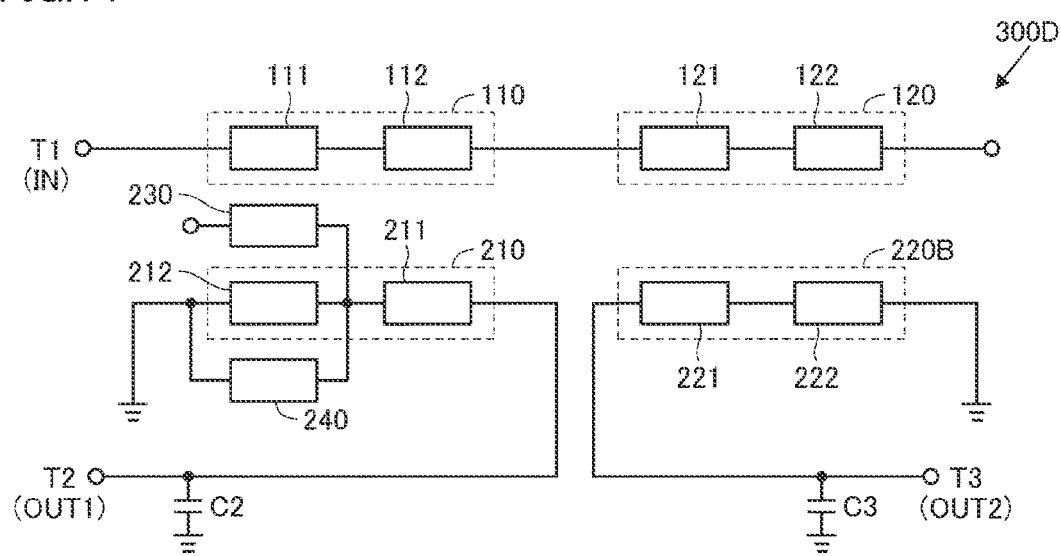
FIG. 14 is a circuit diagram of a balun of a fifth comparative example.

FIG. 14 is a circuit diagram of a balun 300D of the fifth comparative example. The balun 300D of the fifth comparative example has a configuration in which the second sub-line 220 of the balun 100 illustrated in FIG. 2 has been replaced by a second sub-line 220B. In the second sub-line 220B, both the seventh portion 221 and the eighth portion 222 are arranged away from the second main line 120. More specifically, in the exploded perspective view of FIG. 5, this corresponds to a configuration where the seventh portion 221 and the eighth portion 222 are provided on the twelfth layer LY12. Since other configurations in the balun 300D are the same as the balun 100 of the embodiment, the description of overlapping elements is not repeated.

Figure 15:
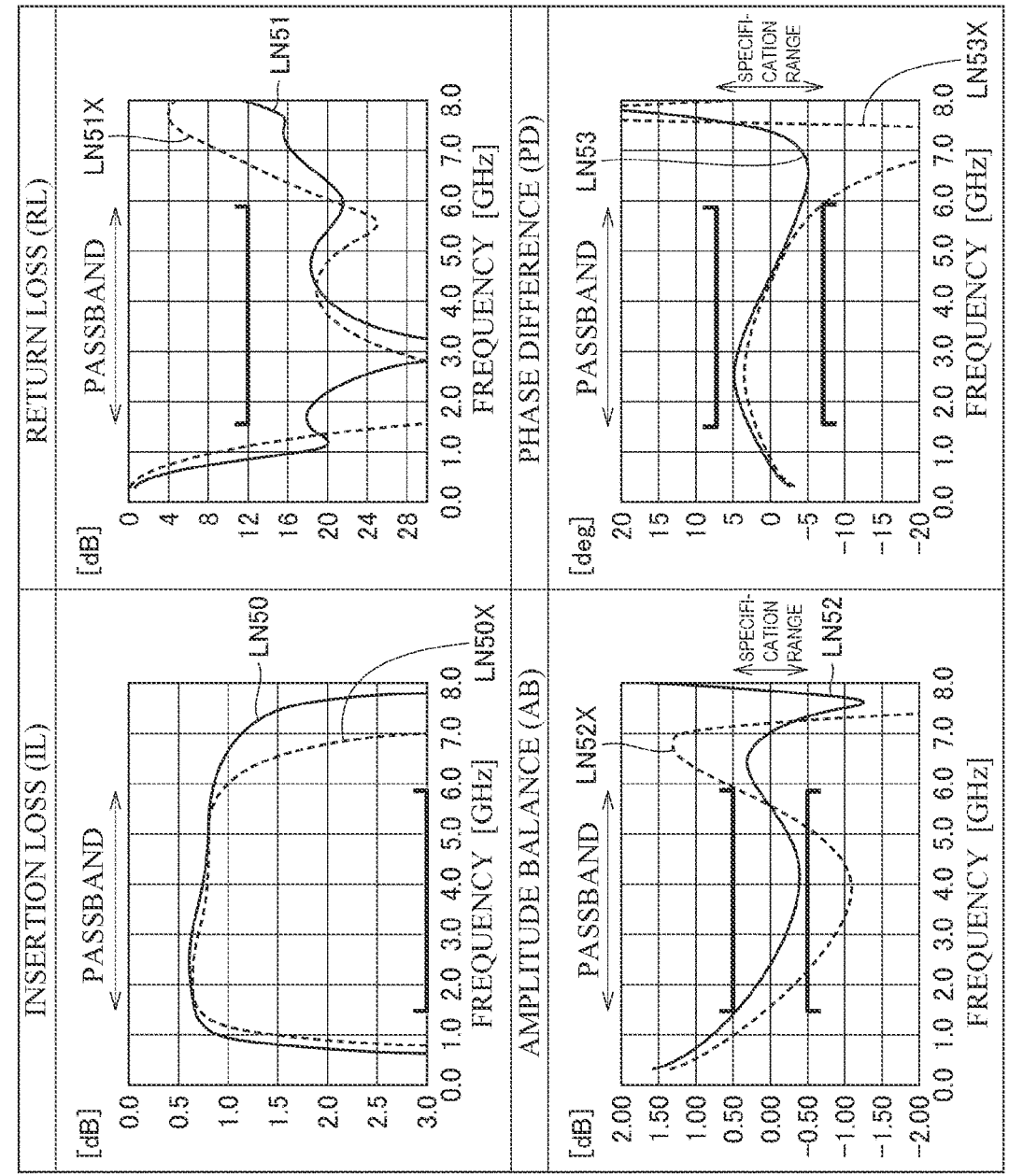
FIG. 15 is a characteristic diagram for describing the comparison between the balun of the embodiment and the balun of the fifth comparative example.

FIG. 15 is a diagram for describing the comparison of the bandpass characteristics of the balun 100 of the embodiment and the balun 300D of the fifth comparative example. FIG. 15 illustrates the bandpass characteristics of the balun 100 of the embodiment (solid lines LN50 to LN53) and the bandpass characteristics of the balun 300D of the fifth comparative example (dashed lines LN50X to LN53X).

Referring to FIG. 15, with regard to insertion loss, like the case of the fourth comparative example, the balun 100 of the embodiment (solid line LN50) has an insertion loss lower than the balun 300D of the fifth comparative example (dashed line LN50X) over a wide frequency band. Moreover, with regard to return loss, in the low frequency domain of the passband, the balun 300D of the fifth comparative example (dashed line LN51X) has a return loss that is partially lower than the balun 100 of the embodiment (solid line LN51), but the baluns 300D and 100 have return losses that are at about the same level in the passband as a whole.

In contrast, with regard to amplitude balance, the balun 300D of the fifth comparative example (dashed line LN52X) has an amplitude difference larger than the balun 100 of the embodiment (solid line LN52), which greatly deviates from the specification range at around 2300 MHz to 5200 MHz. Moreover, with regard to phase difference, the balun 300D of the fifth comparative example (dashed line LN53X) has a large phase difference in the high frequency domain in the vicinity of 6000 MHz to 7500 MHz.

As described above, the balun 100 of the embodiment realizes better bandpass characteristics than the balun 300D of the fifth comparative example.

Sixth Comparative Example

Figure 16:
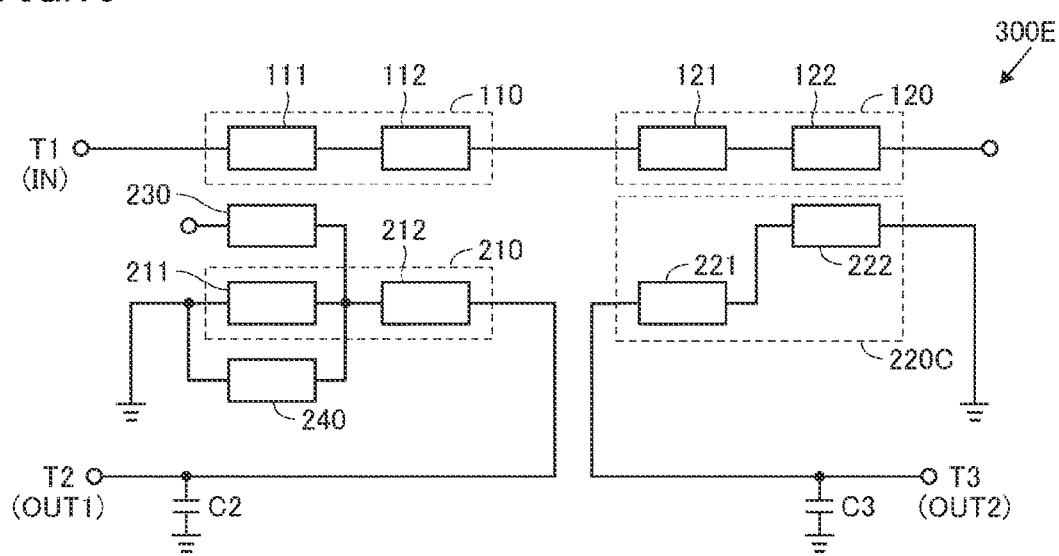
FIG. 16 is a circuit diagram of a balun of a sixth comparative example.

FIG. 16 is a circuit diagram of a balun 300E of the sixth comparative example. The balun 300E of the sixth comparative example has a configuration in which the second sub-line 220 of the balun 100 illustrated in FIG. 2 has been replaced by a second sub-line 220C. In the second sub-line 220C, contrary to the balun 100 of the embodiment, the seventh portion 221 of the second sub-line 220 is arranged farther away than the eighth portion 222. More specifically, in the exploded perspective view of FIG. 5, this corresponds to a configuration where the seventh portion 221 is provided on the twelfth layer LY12, and the eighth portion 222 is provided on the thirteenth layer LY13. Since other configurations in the balun 300E are the same as the balun 100 of the embodiment, the description of overlapping elements is not repeated.

Figure 17:
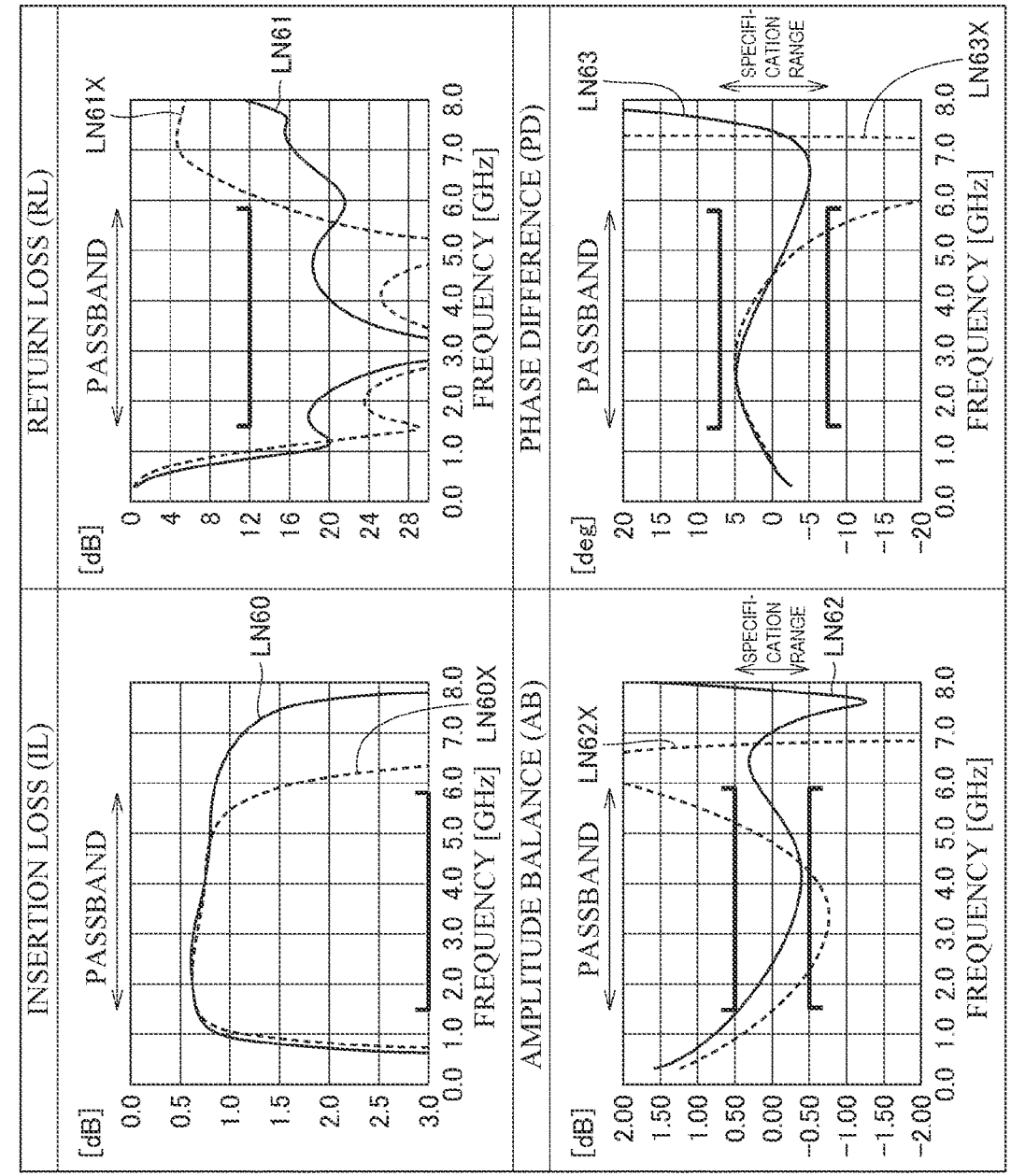
FIG. 17 is a characteristic diagram for describing the comparison between the balun of the embodiment and the balun of the sixth comparative example.

FIG. 17 is a diagram for describing the comparison of the bandpass characteristics of the balun 100 of the embodiment and the balun 300E of the sixth comparative example. FIG. 17 illustrates the bandpass characteristics of the balun 100 of the embodiment (solid lines LN60 to LN63) and the bandpass characteristics of the balun 300E of the sixth comparative example (dashed lines LN60X to LN63X).

Referring to FIG. 17, with regard to insertion loss, like the case of the fourth comparative example and the fifth comparative example, the balun 100 of the embodiment (solid line LN60) has an insertion loss lower than the balun 300E of the sixth comparative example (dashed line LN60X) over a wide frequency band. In contrast, with regard to return loss, although the balun 100 and the balun 300E satisfy the specification range, the balun 300E of the sixth comparative example (dashed line LN62X) has a low return loss overall, as compared with the balun 100 of the embodiment (solid line LN61).

With regard to amplitude balance, the balun 300D of the sixth comparative example (dashed line LN62X) has large fluctuations of amplitude difference, which greatly deviates from the specification range in the intermediate frequency domain (around 2200 MHz to 4200 MHz) and the high frequency domain (around 5200 MHz to 5800 MHz) of the passband. Moreover, with regard to phase difference, the phase difference of the balun 300E of the sixth comparative example (dashed line LN53X) is large and is outside the specification range in the high frequency domain around 5300 MHz to 7200 MHz.

As described above, the balun 100 of the embodiment realizes better bandpass characteristics than the balun 300E of the sixth comparative example.

In general, it is known that the characteristics of the coupling of the main line and the sub-line on the posterior side of the "Marchand balun" are improved by weakening the coupling on the open end side. For example, such a configuration may be realized by narrowing the line width of the main line toward the open end, and narrowing the line width of the sub-line toward the reference potential. In the balun 100 of the embodiment, since the seventh portion 221 of the second sub-line 220 is arranged closer to the second main line 120 than the eighth portion 222, the coupling of the main line and the sub-line on the open end side is weaker than the coupling of the main line and the sub-line on the first main line 110 side. Therefore, by adopting an arrangement such as the balun 100 of the embodiment, bandpass characteristics that are better than those achieved by the arrangement of the baluns 300C to 300E of the fourth to sixth comparative examples may be realized.

The embodiments disclosed here should be considered illustrative in all respects and not restrictive. The scope of the present disclosure is indicated by the scope of claims rather than the description of the above embodiments and is intended to include all changes within the meaning and scope equivalent to the scope of the claims.

REFERENCE SIGNS LIST 1 communication device
10 front-end circuit 100, 300, and 300A to 300E baluns
110 to 112, 120 to 122, 210 to 212, 220, 220A to 220C, 221, 222, 230, 230A, 240, L1, L2, L3, and L4 lines
150 dielectric substrate
151 upper face
152 lower face
153 and 154 side faces
ANT antenna
C2 and C3 capacitors
C10 ground electrode
C21 and C31 flat plate electrodes
DM directional mark
FLT1 and FLT2 filters
GND ground terminal
IN input terminal
LNA low noise amplifier
LY1 to LY14 dielectric layers
MP, MP1, and MP2 midpoints
OP1 opening
OUT1 and OUT2 output terminals
PA power amplifier
RX reception-side line
SW switch
T0 connection terminal
T1 unbalanced terminal
T2 and T3 balanced terminals
TA selection terminal
TC common terminal
TX transmission-side line
V1 to V7 vias

The invention claimed is:

1. A balun comprising:
  a dielectric substrate in which a plurality of dielectric layers are laminated;
  an unbalanced terminal, a first balanced terminal, a second balanced terminal, and a reference potential terminal on the dielectric substrate;
  a first main line having a first end that is connected to the unbalanced terminal;
  a second main line having a first end that is connected to a second end of the first main line, and having a second end that is open;
  a first sub-line connected between the first balanced terminal and the reference potential terminal;
  a second sub-line connected between the second balanced terminal and the reference potential terminal; and
  a parallel line connected in parallel with a part of the first sub-line,
  wherein in a laminating direction of the dielectric substrate, the first sub-line is between the first main line and the parallel line, the parallel line is between the first sub-line and the second sub-line, and the second sub-line is between the parallel line and the second main line, and
    a line length of a portion of the first sub-line that is connected in parallel with the parallel line is different from a line length of the parallel line.

2. The balun according to claim 1, wherein the line length of the parallel line is shorter than the line length of the portion of the first sub-line that is connected in parallel with the parallel line.

* * * * *